(12) United States Patent
Tiebout et al.

(10) Patent No.: US 10,958,298 B2
(45) Date of Patent: Mar. 23, 2021

(54) DIGITAL PRE-DISTORTION TECHNIQUE FOR A CIRCUIT ARRANGEMENT WITH A POWER AMPLIFIER

(71) Applicant: Infineon Technologies AG, Neubiberg (DE)

(72) Inventors: Marc Tiebout, Finkenstein (AT); Michele Caruso, Finkenstein (AT); Daniele Dal Maistro, Villach (AT); Carlo Rubino, Villach Warmbad Judendorf (AT)

(73) Assignee: Infineon Technologies AG, Neubibeg (DE)

( * ) Notice: Subject to any disclaimer, the term of this patent is extended or adjusted under 35 U.S.C. 154(b) by 0 days.

(21) Appl. No.: 16/683,531

(22) Filed: Nov. 14, 2019

(65) Prior Publication Data
US 2020/0169277 A1    May 28, 2020

(30) Foreign Application Priority Data
Nov. 22, 2018    (DE) ............. 10 2018 220 089.0

(51) Int. Cl.
*H04B 1/04*        (2006.01)
*H03F 3/21*        (2006.01)
(Continued)

(52) U.S. Cl.
CPC ........... *H04B 1/0475* (2013.01); *G01R 29/26* (2013.01); *H03F 1/3247* (2013.01); *H03F 3/211* (2013.01);
(Continued)

(58) Field of Classification Search
CPC ......... H04B 1/0475; H04B 2001/0425; H03F 1/3241; H03F 1/3247; H03F 3/211;
(Continued)

(56) References Cited

U.S. PATENT DOCUMENTS

| | | | | |
|---|---|---|---|---|
| 5,900,738 A | * | 5/1999 | Khandros | G01R 1/0466 |
| | | | | 324/750.05 |
| 6,356,146 B1 | * | 3/2002 | Wright | H03F 1/3241 |
| | | | | 330/149 |

(Continued)

OTHER PUBLICATIONS

Office Action, DE 10 2018 220 089.0, dated Aug. 13, 2001, pp. 8.

*Primary Examiner* — Siu M Lee
(74) *Attorney, Agent, or Firm* — Armis IP Law, LLC (57) ABSTRACT

Techniques (implemented in circuit arrangements, methods, computer instructions) are disclosed which permit digital pre-distortion for amplifiers. A common signal source provides a common analog signal from a digital input signal; a plurality of amplifiers amplifies a split signal which is a split version of the common analog signal; a built-in test circuit is configured to provide distortion information associated to distortion affecting the amplifier. The common signal source implements a signal conditioner to perform, in a signal path of the digital input signal, a feed-forward pre-distortion of the digital input signal according to a pre-distortion relationship mapping the digital input signal onto a pre-distorted version. The signal conditioner is configured to adjust the pre-distortion relationship in dependence on the distortion information.

30 Claims, 7 Drawing Sheets

(51) Int. Cl.
*H03F 1/32* (2006.01)
*G01R 29/26* (2006.01)

(52) U.S. Cl.
CPC .................. *H03F 2200/451* (2013.01); *H03F 2201/3227* (2013.01); *H03F 2201/3233* (2013.01); *H03F 2203/21106* (2013.01); *H04B 2001/0425* (2013.01)

(58) Field of Classification Search
CPC ............ H03F 3/213; H03F 2200/451; H03F 2201/32; H03F 2201/3212; H03F 2201/3215; H03F 2201/3218; H03F 2201/3227; H03F 2201/3231; H03F 2201/3233; H03F 2203/21106; G01R 29/26
USPC ......................................... 375/295, 296, 297
See application file for complete search history.

(56) References Cited

U.S. PATENT DOCUMENTS

| | | | |
|---|---|---|---|
| 6,404,276 B1* | 6/2002 | Liu ................... | H03H 11/1252 327/552 |
| 6,697,436 B1* | 2/2004 | Wright .............. | G01N 27/4163 330/106 |
| 6,798,843 B1* | 9/2004 | Wright .................. | H03F 1/3241 330/149 |
| 7,042,283 B2* | 5/2006 | Suzuki ................. | H03F 1/0288 330/124 R |
| 9,831,899 B1* | 11/2017 | Boghrat ............... | H04B 1/0475 |
| 2008/0152037 A1* | 6/2008 | Kim ...................... | H04W 40/02 375/297 |
| 2015/0236877 A1* | 8/2015 | Peng ...................... | H04L 25/08 375/297 |
| 2015/0326327 A1* | 11/2015 | Carlsson ............... | H03F 1/3241 375/224 |
| 2015/0333850 A1* | 11/2015 | Myoung ............. | H04B 1/0475 455/84 |

* cited by examiner

DIGITAL PRE-DISTORTION TECHNIQUE FOR A CIRCUIT ARRANGEMENT WITH A POWER AMPLIFIER

RELATED APPLICATION

This application is related to and claims priority to earlier filed German patent application serial number 10 2018 220089.0 entitled "DIGITAL PRE-DISTORTION TECHNIQUE FOR A CIRCUIT ARRANGEMENT WITH A POWER AMPLIFIER," filed on Nov. 22, 2018, the entire teachings of which are incorporated herein by this reference.

BACKGROUND

A circuit arrangement with a high frequency, HF, radio frequency, RF, and/or mmWave power amplifier is known. For example, an antenna element of an antenna array may be fed with HF, RF, and/or mmWave signals. The antenna element may constitute, together with other antenna elements, an antenna array. The antenna array may be used for beamforming, e.g., in communication or localization applications. The circuit arrangement may be controlled, for example, by a digital processor, such as a digital signal processor (DSP), which may generate a digital input signal which, after having being converted into an analog signal, is amplified by the power amplifier.

In order to minimize power consumption, the efficiency shall be high. However, in power amplifiers, increasing efficiency tends to reduce linearity, causing amplitude distortion and/or phase distortion. For example, at some ranges of values of the input signal, the amplified signal may saturate, hence losing linearity and increasing distortion. Therefore, an increase of efficiency normally comes at the expenses of linearity and quality.

It is possible to try to cope with these impairments by using a feedback-based pre-distortion technique. The analog signal at the output of the HF, RF, and/or mmWave power amplifier may be converted into a digital version, which is fed back to the processor and subtracted from the digital input signal. The feedback-based pre-distortion technique may be therefore be operated to adjust (pre-distort) the digital input signal such that even after saturation, overall desired linearity is obtained.

Such a digital feedback-based pre-distortion technique requires complicated feedback functions, which shall perform subtractions in real time for each value of the amplified output signal. An instance of the feedback function is necessary for each antenna element of the antenna array: accordingly, 64 antenna elements require 64 instances of the feedback function. Hence, a great amount of processing power is necessary for performing the on-line subtractions at the processor.

A feedback-based technique has been attempted consisting in performing one single digital pre-distortion function for multiple amplifiers. However, it is in general not ensured that all the amplifiers are subject to the same distortions. Hence, using one single digital pre-distortion for multiple, different amplifiers inherently leads to incomplete pre-distortions for at least some of the amplifiers. Still even if efficiency improvement would be very small, the power consumption benefit is integrated over lifetime, so every 1% is valuable.

Further, in case a plurality of amplifiers (e.g., when operating beamforming) is implied, each feedback should be provided to one single RF to digital converter (which may comprise an analog to digital, ADC, converter) hence implying a complicated equipment.

BRIEF DESCRIPTION OF INVENTIVE EMBODIMENTS

In accordance to examples, there is provided a circuit arrangement comprising:
   an amplifier for amplifying an analog version of a digital input signal;
   a built-in test circuit operative to provide distortion information associated to distortion affecting the amplifier; and
   a signal conditioner to perform, in a signal path of the digital input signal, a feed-forward pre-distortion of the digital input signal according to a pre-distortion relationship mapping the digital input signal onto a pre-distorted version,
   wherein the signal conditioner is operative to adjust the pre-distortion relationship in dependence on the distortion information.

Accordingly, there is no need for a real-time feedback-based solution.

In accordance to an aspect, there is provided a transmission/reception device comprising the circuit arrangement and at least one antenna element operatively connected to the amplifier.

In accordance to an aspect, there is provided a method comprising:
   performing a calibration for at least one amplifier to obtain distortion information regarding the distortion impairing the at least one amplifier;
   operating the at least one amplifier by digitally adjusting a digital input signal at the at least one amplifier on the basis of distortion information obtained at the calibration.

In accordance to an aspect, there is provided a non-transitory storage unit storing instructions which, when executed by a processor the processor to perform a method as above.

Techniques (implemented in circuit arrangements, methods, computer instructions) are disclosed which permit digital pre-distortion for amplifiers. A common signal source provides a common analog signal from a digital input signal; a plurality of amplifiers amplifies a split signal which is a split version of the common analog signal; a built-in test circuit is configured to provide distortion information associated to distortion affecting the amplifier. The common signal source implements a signal conditioner to perform, in a signal path of the digital input signal, a feed-forward pre-distortion of the digital input signal according to a pre-distortion relationship mapping the digital input signal onto a pre-distorted version. The signal conditioner is configured to adjust the pre-distortion relationship in dependence on the distortion information.

Embodiments herein include a circuit comprising:
   an amplifier operative to amplify an analog signal, the signal being derived from a digital input signal;
   a built-in test circuit operative to provide distortion information associated with distortion of the amplifier;
   a signal conditioner to perform, in a signal path of the digital input signal, a feed-forward predistortion of the digital input signal according to a pre-distortion relationship mapping the digital input signal onto a pre-distorted version,
   the signal conditioner being further operative to adjust the pre-distortion relationship depending on the distortion information.

Further embodiments herein include a circuit comprising:
a common signal source operative to provide a common analog signal from a digital input signal;
a plurality of amplifiers operative to amplify a split signal which is a split version of the common analog signal;
a built-in test circuit operative to provide distortion information associated to distortion affecting the plurality of amplifiers;
the common signal source operative to implement a signal conditioner that performs, in a signal path of the digital input signal, a feed-forward pre-distortion of the digital input signal according to a pre-distortion relationship mapping the digital input signal onto a pre-distorted version; and
the signal conditioner operative to adjust the pre-distortion relationship depending on the distortion information.

In accordance with further embodiments, the pre-distortion relationship maps magnitude information of the digital input signal onto pre-distorted symbols of the pre-distorted version of the digital input signal.

In accordance with still further embodiments, the signal conditioner is operative to apply a variable phase shift to the digital input signal according to the pre-distortion relationship, wherein the signal conditioner is operative to adjust the pre-distortion relationship depending on the distortion information in which the pre-distortion relationship maps magnitude information on the digital input signal onto a phase shift depending on the distortion information.

In further example embodiments, the signal conditioner is operative to apply a gain to the digital input signal according to the pre-distortion relationship,
wherein the signal conditioner is operative to adjust the pre-distortion relationship depending on the distortion information such that the pre-distortion relationship maps magnitude information on the digital input signal onto a gain depending on the distortion information.

In still further example embodiments, the pre-distortion relationship is non-linear.

Further embodiments herein include a built-in test circuit operative to determine an amplified signal at the output of the amplifier to derive the distortion information.

In one embodiment, the circuit further include a test injection block operative to inject a signal having a settable amplitude to measure distortion information with respect to the injected signal at the output of the at least one power amplifier.

In yet further example embodiments, the circuit is further operative to switch between a test mode and an operating mode, the test mode operative to measure distortion information and determine the relationship mapping the digital input signal onto the pre-distorted version of the digital input signal.

In accordance with further embodiments, the signal conditioner is operative to pre-distort the digital input signal proportional to a magnitude of the digital input signal.

In one embodiment, the signal conditioner is operative to pre-distort the digital input signal: for a comparatively large amount in case of comparatively large distortion; and for a comparatively small amount in case of comparatively small distortion.

In yet further example embodiments, the circuit includes a plurality of amplifiers each independently controlled according to a particular pre-distortion relationship.

In yet further example embodiments, the circuit is operative to repeat a plurality of test iterations to measure, at each test iteration, distortion information and determine the pre-distortion relationship for one amplifier of the plurality.

In one embodiment, a combination of the signal conditioner and the built-in test circuit is associated with a plurality of amplifiers.

In further example embodiments, the signal conditioner is implemented in a digital signal processor, DSP.

In accordance with still further embodiments, the circuit includes an integrated circuit, on which the amplifier and the built-in test circuit are mounted.

Further embodiments herein include a transmission/reception device comprising the circuit as previously discussed and at least one antenna element operatively connected to the amplifier.

Further embodiments herein include a method comprising: performing a calibration for at least one amplifier to obtain distortion information regarding distortion attributes impairing the at least one amplifier; digitally adjusting a digital input signal of the at least one amplifier based on distortion information obtained at the calibration.

In yet further example embodiments, the calibration is reiterated for each of a plurality of amplifiers, and the signal adjustment is performed for each of the plurality of power amplifiers.

In accordance with further embodiments, the calibration is performed at the initialization of the circuit arrangement 100 and/or when the circuit arrangement is switched on and/or periodically every at least 360 seconds.

Further embodiments herein include a non-transitory storage unit storing instructions which, when executed by a processor, cause the processor to perform a method as previously discussed.

Further embodiments herein include computer-readable storage hardware having instructions stored thereon, the instructions, when carried out by computer processor hardware, cause the computer processor hardware to: perform a calibration for each amplifier of a plurality of amplifiers to acquire distortion information regarding the distortion impairing the amplifiers; and operate the plurality of amplifiers by digitally adjusting a digital input signal, which is subsequently split and amplified at the amplifiers, on the basis of distortion information acquired at the calibration.

DETAILED DESCRIPTION OF EXAMPLE EMBODIMENTS

Figure 1A:
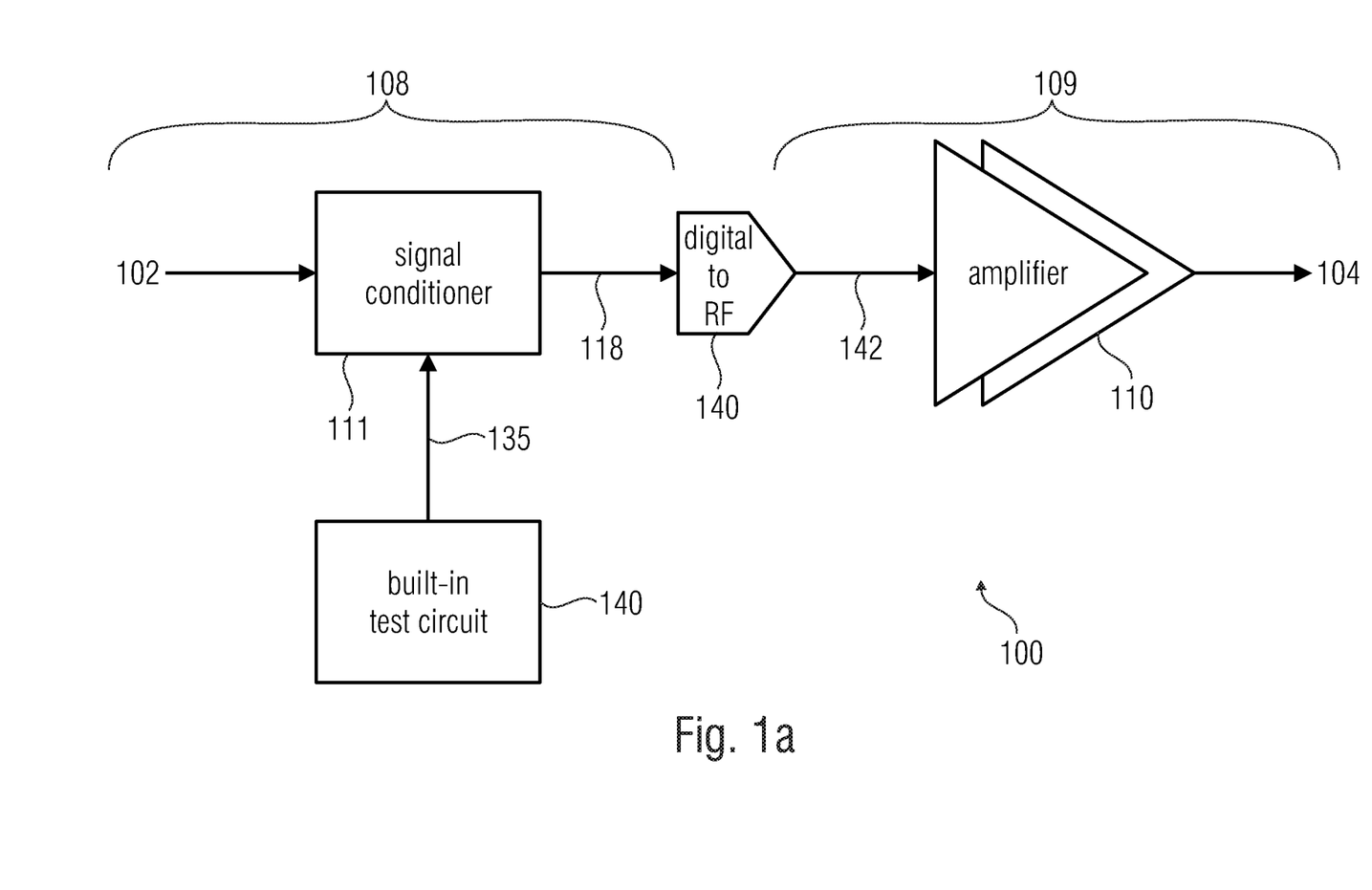
FIGS. 1a, 1b, 2, 3, and 4 show circuit arrangements according to example embodiments herein.

FIG. 1a shows an essential scheme of an example of a circuit arrangement 100 including at least one amplifier 110. The amplifier 110 is intended, for example, to amplify an analog version 142 of a digital input signal 102, to obtain an analog amplified version 104 of the digital input signal 102. The circuit arrangement 100 includes a digital signal path 108 and an analog signal path 109, which is optionally divided from each other by a digital to RF converter 140 (which comprises a digital to analog, DAC, converter, for example).

The digital input signal 102, in examples, is a modulated signal. The digital input signal 102 is, in examples, a HF, RF, and/or mmWave signal. The digital input signal 102 is, in examples, a RF, HF, or mmWave signal. The digital input signal 102 is, in examples, a mmWave signal. In general terms, along the digital signal path 108, the digital input signal 102 is processed to generate the input to the power amplifier 110.

The amplifier 110 is, for example a HF, RF, and/or mmWave amplifier. The amplifier 110 is, for example a power amplifier. The analog amplified version 104 of the digital input signal 102 is fed, for example, to an antenna, such as an antenna element of an antenna array (e.g., operated in beamforming).

Other components and/or connections, which are placed between the elements depicted in FIG. 1a, are here not shown for clarity. For example, a delay generator can be inserted (e.g., upstream or downstream of the amplifier 110) to operate in beamforming.

As such, the amplifier 110 is subjected to unrequested amplitude variations, which tend to reduce linearity. However, these variations can be compensated even without a feedback-based technique. In the digital signal path 108 upstream of the amplifier 110, digital processing is implemented, which permits to modify the digital input signal 102 in the digital signal path 108 without a feedback-based technique, and maintaining linearity. In particular, a feed-forward pre-distortion is performed, so as to feed the amplifier 110 with a pre-distorted signal which keeps into account the distortion affecting the amplifier 110.

To permit the feed-forward pre-distortion, the digital signal path 108 comprises a digital signal conditioner 111, which processes the digital input signal 102, to obtain a digital pre-distorted version 118 of the digital input signal 102. The digital signal conditioner 111 is implemented, for example, as a functional block in a digital signal processor, DSP. The digital signal conditioner 111 performs a feed-forward predistortion of the digital input signal 102. The digital pre-distorted version 118 of the digital input signal 102 is converted onto an analog version 142 (e.g., by the digital to RF converter 140). Accordingly, the amplifier 110 can be fed with a pre-distorted analog version 142 of the digital input signal 102.

The digital signal conditioner 111 processes the digital input signal 102 in the digital signal path 108 so as to map magnitude information regarding the digital input signal 102 onto pre-distorted symbols of the pre-distorted version 118 of the digital input signal 102. For example, the larger the magnitude of the digital input signal 102, the stronger the pre-distortion, and/or vice versa. The digital input signal 102 applies a variable phase shift to the digital input signal 102, so that the pre-distorted version 118 of the digital input signal 102 has a different phase with respect to the digital input signal 102. The digital input signal 102 applies a variable gain to the digital input signal 102, so that the pre-distorted version 118 of the digital input signal 102 has a different amplitude with respect to the digital input signal 102.

The pre-distortion at the digital signal conditioner 111 is based, for example, on distortion information 135 provided by a built-in circuit 140. The distortion information 135 carries information concerning the distortion affecting the amplifier 110, permitting to distinguishing whether the amplifier 110 suffers of high distortion (hence, requiring strong pre-distortion) of whether the amplifier 110 suffers of low distortion or no distortion (hence, requiring strong weak pre-distortion or no pre-distortion, respectively). The distortion information 135 is obtained, for example, during calibration (test) sessions, which is performed sporadically (e.g., at frequency enormously smaller than the bandwidth of the digital input signal 102), and is performed at intervals of 1 hour (3600 seconds) or more.

The signal conditioner 111 operates by converting the digital input signal 102 onto the pre-distorted version 118 according to a pre-distortion relationship which maps symbols of the digital input signal 102 onto symbols of the pre-distorted version 118. In one embodiment, the pre-distortion relationship is non-linear. The pre-distortion relationship be adjusted in dependence on the distortion information 135. The pre-distortion relationship pre-distorts the digital input signal 102 for a comparatively large amount in case of comparatively large distortion, and/or for a comparatively small amount in case of comparatively small distortion. The pre-distortion relationship maps magnitude information on the digital input signal 102 onto symbols of the pre-distorted version 118 of the digital input signal 102. The pre-distortion relationship maps magnitude information on the digital input signal 102 onto a phase shift in dependence on the distortion information 135. The pre-distortion relationship maps magnitude information on the digital input signal 102 onto a gain in dependence on the distortion information 135. Other mappings are possible.

Figure 1B:
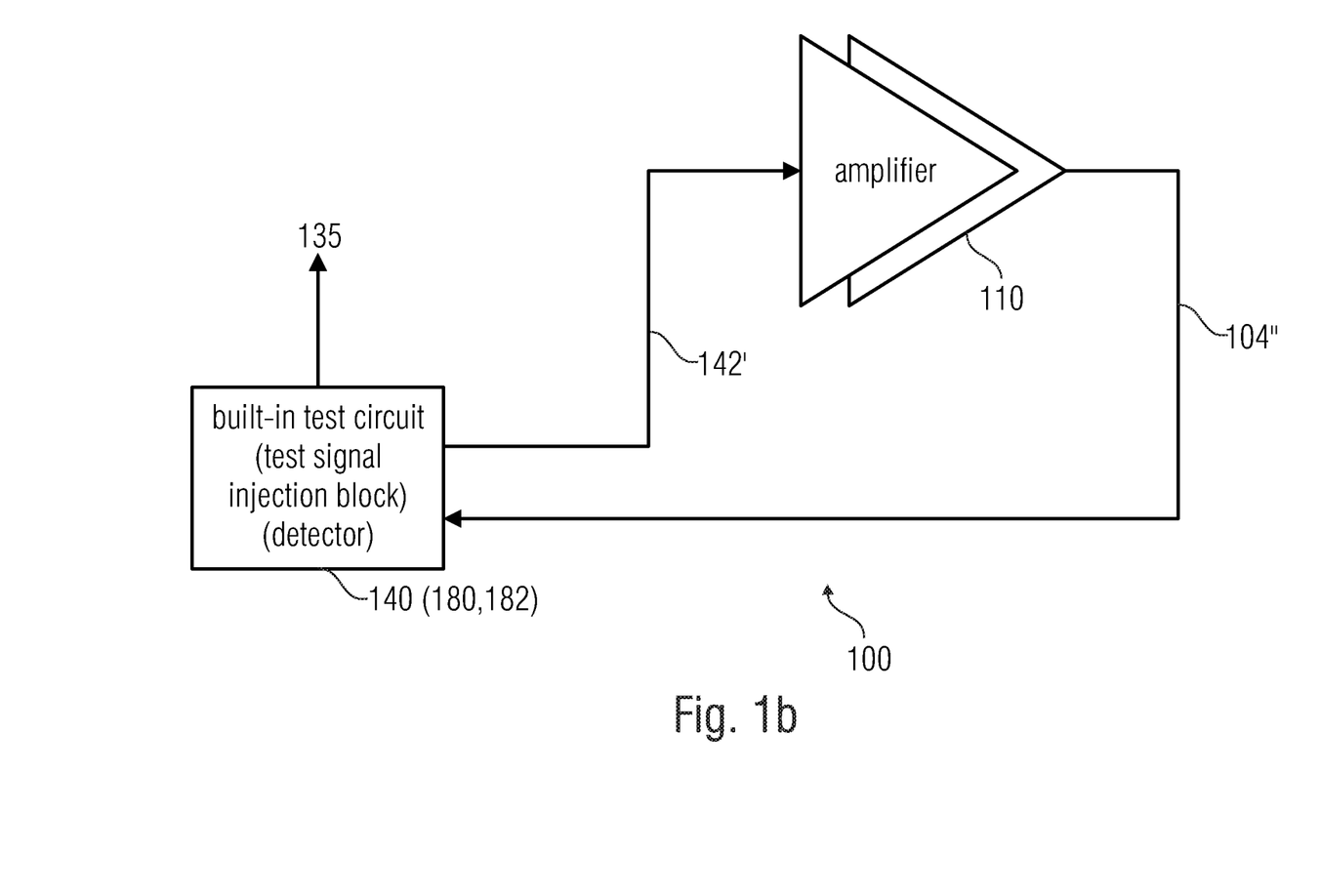

In order to obtain the distortion information 135, a calibration (test) session is performed. FIG. 1b shows a possible implementation of the calibration using elements of FIG. 1a. As shown by FIG. 1b, a test signal injection block is implemented for generating an analog test input signal 142'. In FIG. 1b, the test signal injection block is represented as being integrated with the built-in test circuit 140. The analog test input signal 142' is fed to the amplifier 110. The amplified signal 104" at the output of the amplifier 110 is inputted to a detector. Here, the detector is represented as being integrated with the built-in test circuit 140. Accordingly, the built-in test circuit 140 determines the pre-distortion affecting the amplifier 110. If, for example, the amplified output signal 104" significantly differs from the analog test input signal 142', a high distortion is determined, and vice versa.

Therefore, the distortion information 135 provides information regarding the distortion on the basis of the analog test input signal 142'. For example, the distortion information 135 provides information associated to a difference between the analog test input signal 142' and the amplified signal 104".

The test signal injection block sweeps among a plurality of magnitudes of the analog test input signal 142', so as to obtain different distortion measurements for different magnitudes. Accordingly, the distortion information 135 provides information concerning the distortion for different magnitudes of the analog test input signal 142'. Other methods of the circuit can be implemented.

The obtained magnitude information 135 is used to define the pre-distortion relationship. The magnitude information and/or data associated to the pre-distortion relationship (e.g., mapping magnitudes of the digital input signal 102 onto symbols of the pre-distorted version 118) is stored in a look-up table, LUT. The LUT contains a function (which is non-linear) which is used to map the magnitude information into phase shift adjustment signal and/or the gain adjustment signal. The LUT comprises a table of symbols (constellation diagram), whereas modifications are set according to the distortion information 135.

After having obtained the distortion information 135, the circuit arrangement 100 operates as in FIG. 1a. The magnitude information 135 (e.g., in a version stored in a LUT or in another version) is used by the signal conditioner 111 in the operating mode.

Accordingly, the circuit arrangement operates in a feedforward fashion, as it is not necessary to continuously obtain a feedback from the amplifier 104.

Figure 2:
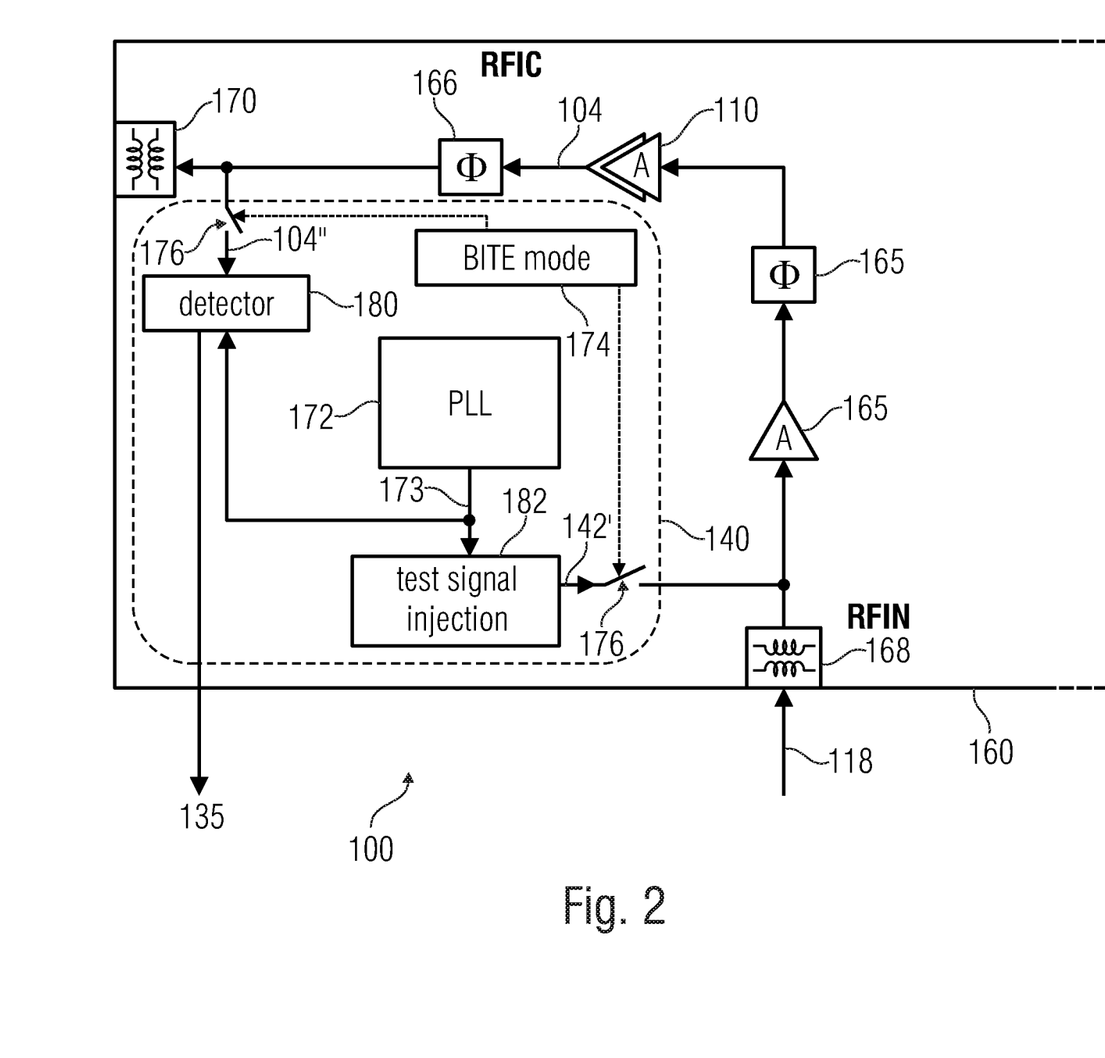

FIG. 2 shows a possible implementation of element of a built-in test circuit, and instantiates examples according to FIGS. 1*a* and 1*b*. In particular, FIG. 2 shows an integrated circuit 160 (which is a radio frequency integrated circuit, RFIC), on which the built-in test circuit and the amplifier is mounted. The integrated circuit 160 comprises an input port 168 (e.g., from a DSP or another processor, which implements the signal conditioner 111, to obtain the pre-distorted version 118 of the input signal 102) and/or an output port 170 (e.g., towards an antenna element). The RFIC 160 includes an analog phase shifter 166, which is controlled for shifting a phase, e.g., under the control of a processor (which also can be the DSP), e.g., for beamforming. The RFIC 160 includes a version of the amplifier 110 (which is subjected to distortion). In some implementations, other analog components 165 (here represented as a phase shifter and an amplifier) is implemented.

The integrated circuit 160 comprises a version of the built-in test circuit 140. The built-in test circuit 140 comprises a test signal injection block 182 for generating the analog test input signal 142' to be fed to the amplifier 110. The built-in test circuit 140, in the test session, includes a detector 180 which detects the amplified signal 104" obtained downstream to the amplifier 110. The detector 180 outputs, for example, distortion information 135 obtained in the test session (calibration session). A phase locked loop, PLL, block 172 is used to generate a timing 173, e.g., to be used by the test signal injection block 182 and/or the detector 180.

The built-in test circuit 140 switches between a test mode (for performing a test or calibration session) and an operating mode (for performing an operating session).

Here, a built-in test equipment, BITE, mode selector 174 is represented to perform a selection by controlling switches 176. When the switches are closed, the built-in test circuit 140 operates in test mode (FIG. 1*b*). When the switches are open, the built-in test circuit 140 operates in operating mode (FIG. 1*a*).

Figure 3:
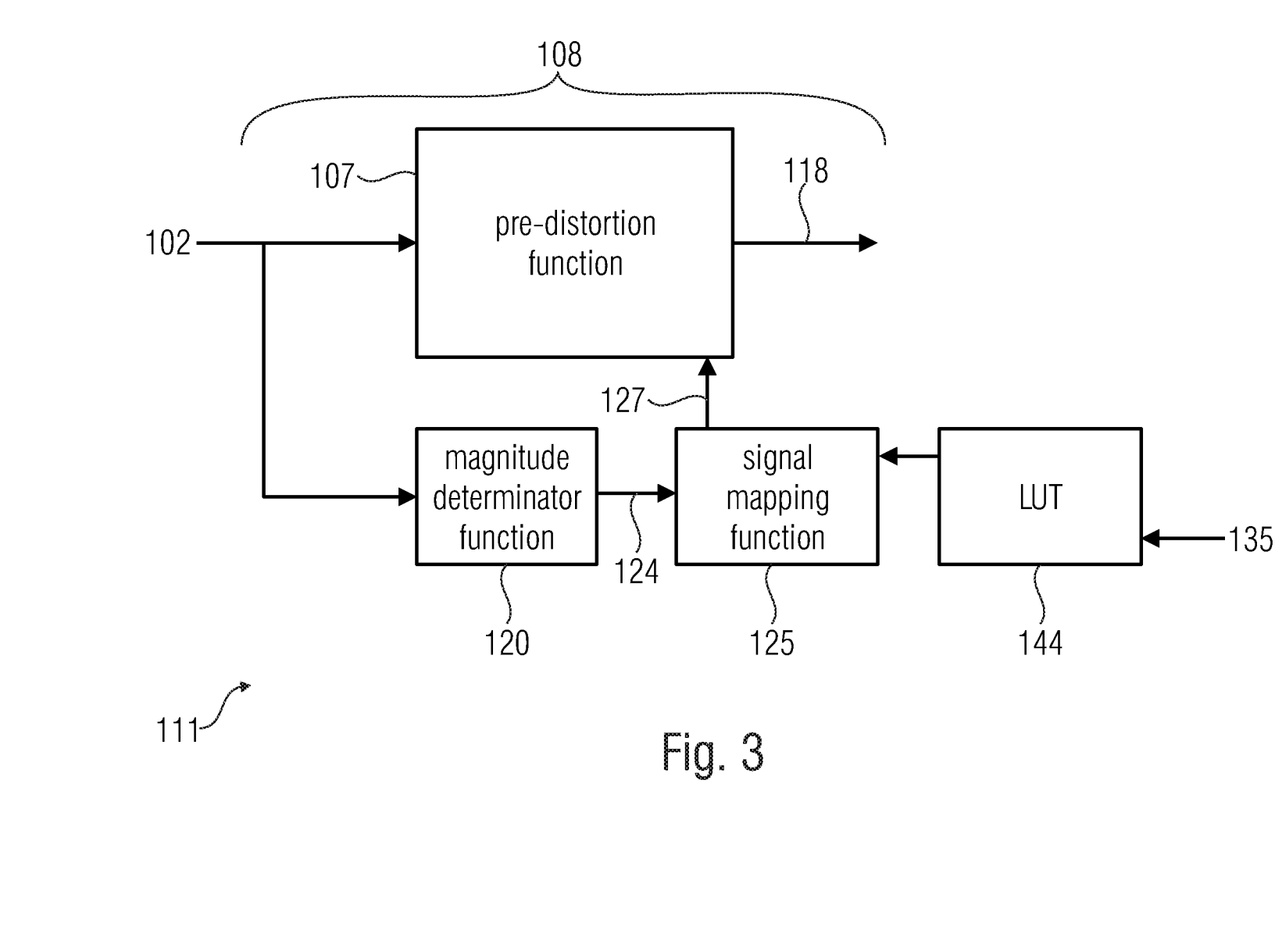

FIG. 3 shows a particular example for implementing a signal conditioner 111 (e.g., the signal conditioner of FIG. 1*a*). The signal conditioner 111 is obtained, for example, with functional elements at disposal of a processor (the processor is a DSP, for example). The signal conditioner 111 includes, for example, a pre-distortion function 107, which processes the digital input signal 102 to obtain the pre-distorted version 118 of the digital input signal 102. A magnitude determinator function 120 is implemented to obtain magnitude information 124 (e.g., the magnitude) on the current symbols of the digital input signal 102. The pre-distortion function 107 makes use of mapping data 127 provided by a digital signal mapping function 125. The mapping data 127 instantiates the pre-distortion relationship, e.g., by mapping symbols of the digital input signal 102 into symbols of the pre-distorted version 118 (e.g., magnitude information 124 is mapped into symbols of the pre-distorted version 118). The signal mapping function 125 obtains the mapping from a LUT 144. The LUT 144 contains relationships between symbols of the signal 102 and its version 112 (or symbols of the signal 102 and phase shifts and/or gains to be applied) based on the distortion information 135.

The operations discussed above for elements 107, 120, and 125 of FIG. 3 are in general performed in the operating mode (FIG. 1*a*; FIG. 2, with open switches). During the test mode (FIG. 1*b*; FIG. 2 with closed switches), the LUT 144 is populated with data which instantiate the pre-distortion relationship.

It is not necessary that the circuit arrangement contains one single amplifier: in one embodiment, there are several amplifiers, each subjected to a different distortion. Notwithstanding, it has been noted that, even using one single processor (e.g., DSP) for implementing the signal conditioner 111, the distortions of a plurality of amplifiers notwithstanding are pre-compensated. Different amplifiers are in general subjected to different distortions, but it is possible to pre-distort each signal for each amplifier. In the test mode, it is simply possible to obtain the distortion information 135 by re-iterating the test session for each amplifier, so that the distortion information 135 appears as a collection of data, each directed to one specific amplifier (for example, there will be one LUT for each specific amplifier).

Figure 4:
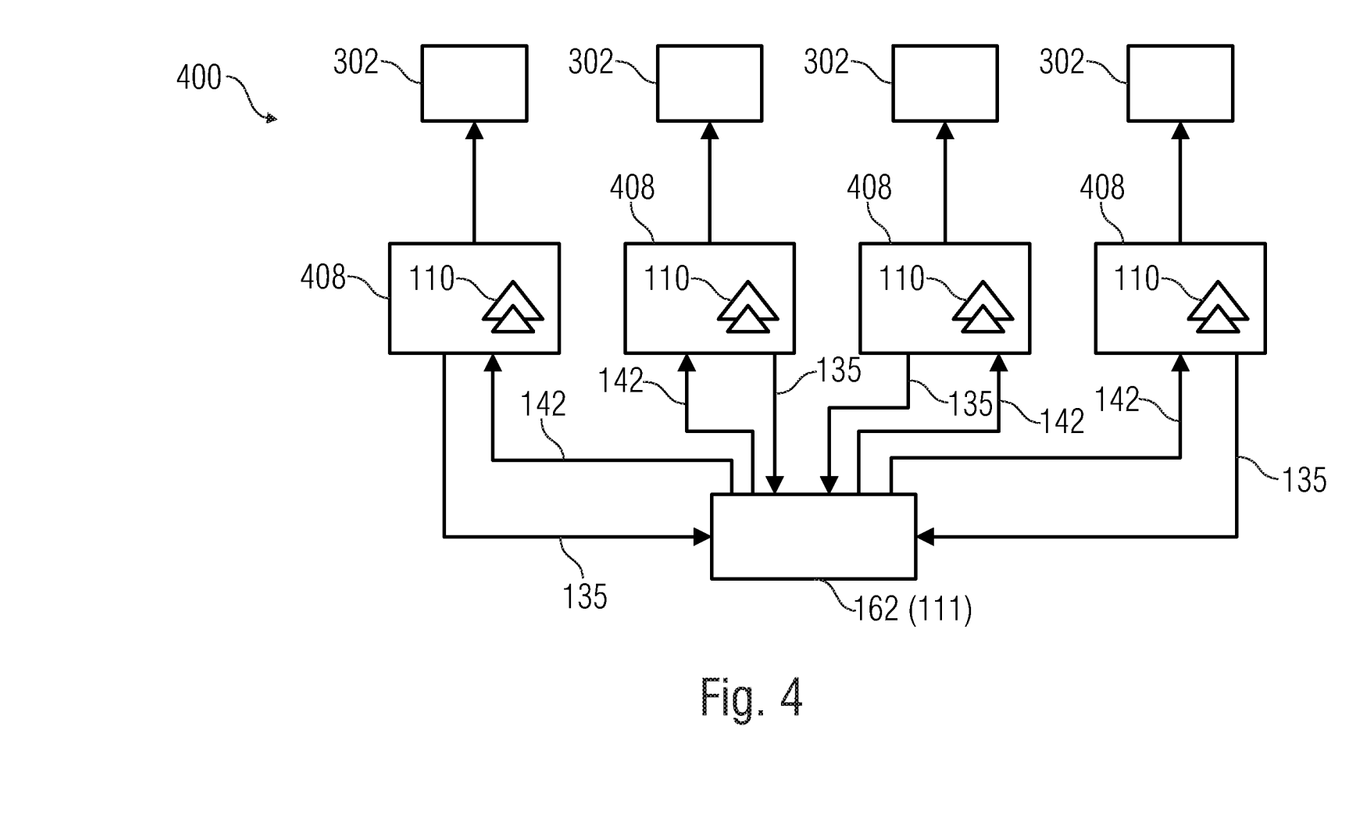

FIG. 4 shows an example of a device 400 (which is a transmission/reception device) including a plurality of amplifiers 110 (which be high frequency, RF, HF amplifiers, or mmWave power amplifiers), for example. Each amplifier 110 includes a respective branch 408. In general, the different amplifiers 110 are impaired by different non-linearities. Each branch 408 is controlled independently, e.g., for beamforming. A processor 162 (e.g., a DSP), which implements the signal conditioner 111, controls each branch 408, and provides each amplifier 110 with a pre-distorted signal 142. Each pre-distorted signal 142 is processed for the particular amplifier 110, so as to pre-compensate for its particular distortion. Therefore, the pre-distorted signals 142 at different branches 408 are in general different from each other. Each of the pre-distorted signal 142 is generated by a technique as discussed above. For each branch 408, the built-in test circuit 140 is implemented. Therefore, each branch 408 appears as the RFIC 160 of FIG. 2. Distortion information 135 therefore is provided to the DSP 162. The DSP 162 therefore obtains a pre-distortion relationship to be used in the operation mode.

By relying on the present feedforward technique, each amplifier 110 at each branch 408 is fed with a signal 142 which is adapted to its particular distortion. There is no need for performing one single pre-distortion for all the different amplifiers. Hence, the different distortions which afflict different HF, RF, and/or mmWave power amplifiers are compensated in a one-by-one fashion.

Further, it is possible to use one signal hardware component (DSP, RF to digital converter, for example) for multiple amplifiers.

Figure 5:
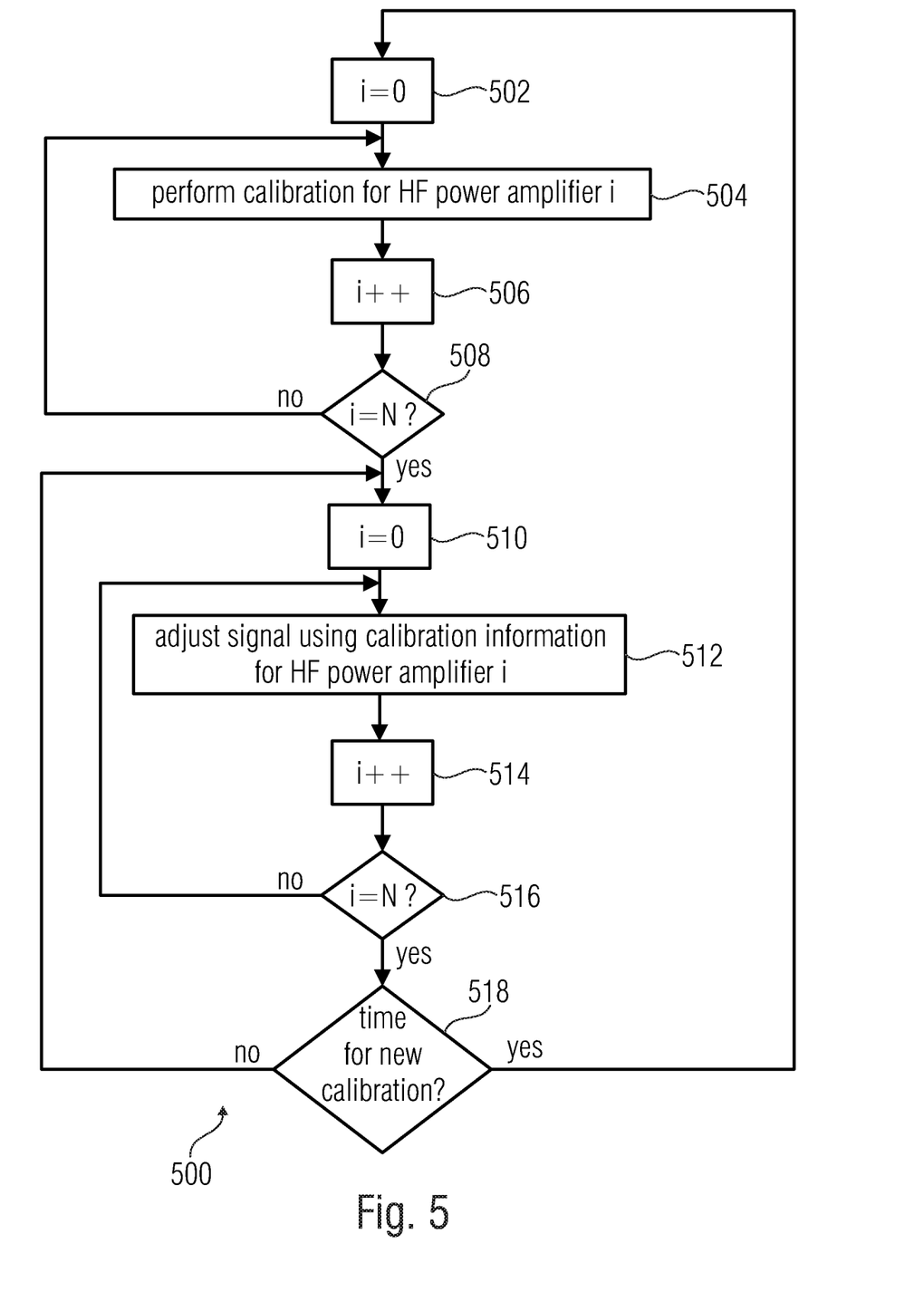
FIG. 5 shows a method according to an example embodiments herein.

FIG. 5 shows a method 500 which is implemented, for example, with a device such as the device 400.

There are here hypothesized N power amplifiers, each being associated to an integer i=[0 ... N−1]. At step 502, the first power amplifier 0 is chosen. At step 504, calibration is performed for the power amplifier 0, e.g., by injecting an analog test input signal 142' in the first power amplifier 0, by detecting the amplified signal 104" output by the amplifier 0, and by determining the distortion information 135 associated to the amplifier 0, for at least one magnitude of analog test input signal 142', and updating the LUT (the process is repeated by sweeping the magnitude of analog test input signal 142' among a plurality of values, e.g., to associate different distortions to different magnitudes). At step 506, the subsequent power amplifier i+1 (e.g., 1) is chosen by updating the index i (e.g., which an operation such as i++). At step 508 it is checked if the last power amplifier N−1 has been already calibrated. If there are other power amplifiers to be calibrated ("NO", i.e., i<N), then a new calibration is performed by reiterating the cycle formed by the steps 504-506.

If all the power amplifiers have been calibrated ("YES", i.e., i=N), then a new operation session can be started. At step 510, the first power amplifier 0 is chosen. At step 512, the digital input signal 102 is pre-distorted, e.g., according to a pre-distortion relationship identified in the calibration (e.g., by retrieving data form the LUT). At step 516, a new power amplifier i+1 (e.g., 1) is chosen. If there are other power amplifiers to be chosen ("NO", i<N), the step 514 is invoked again for the subsequent power amplifier. If no other power amplifiers to be chosen ("YES", i=N), then at step 518 it is checked if it is time for a new calibration session. If it is not time for a new calibration session ("NO"), a new signal adjustment be performed by reiterating the cycle formed by steps 512-514. If it is time for a new calibration session ("YES"), a new calibration session is invoked at steps 502-508.

Figure 6:
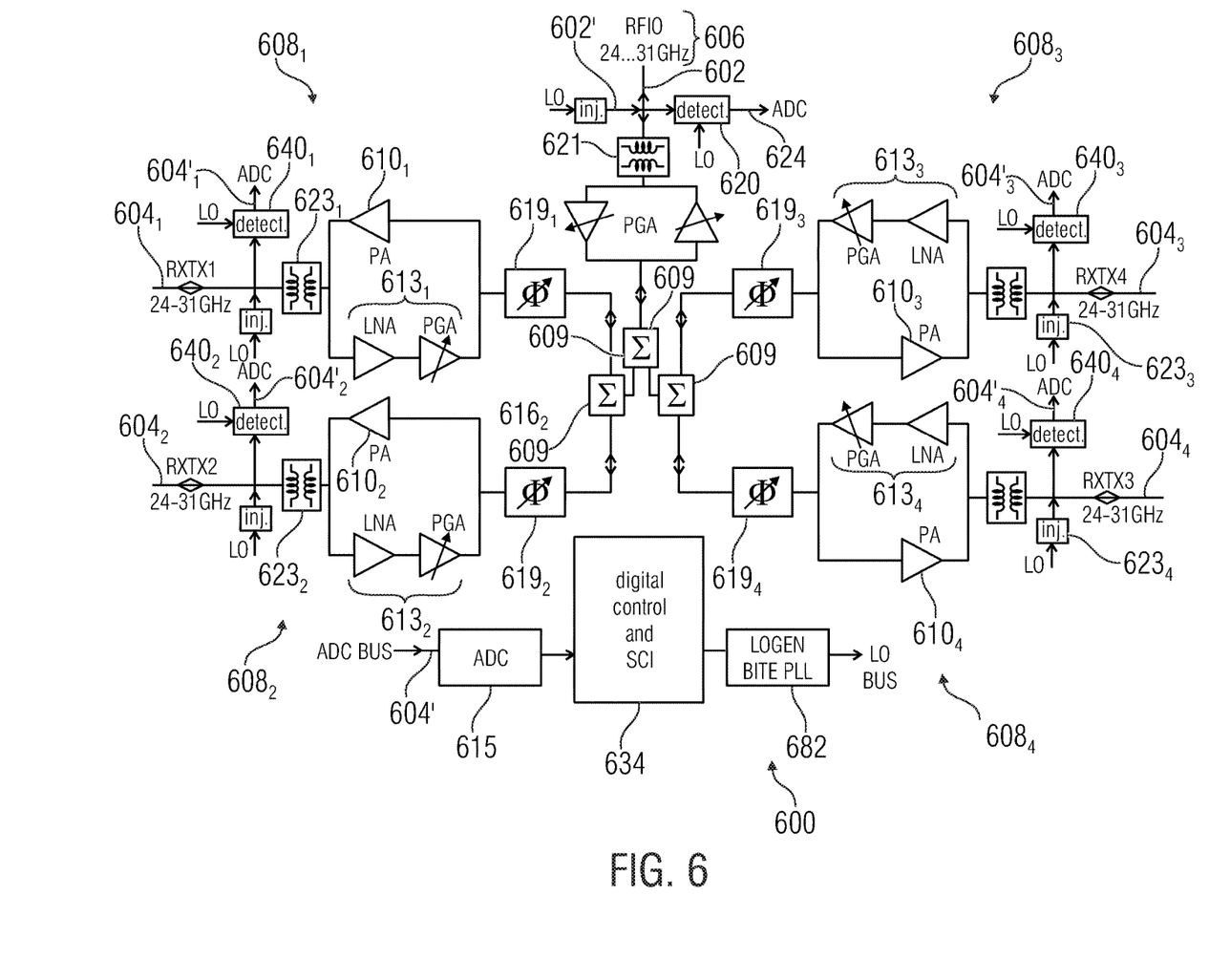
FIG. 6 shows a circuit arrangement according to an example embodiments herein.

FIG. 6 shows a circuit arrangement 600, which is an example of the circuit arrangement 400, and provides a plurality of output signals 604, e.g., for beamforming. An analog input signal 602 (which is an analog version of a non-shown digital input signal) is provided by a common signal source 606 (which is internal or external). The common signal source 606 implements, for example, the signal conditioner 111. The input signal 602 is split (e.g., by splitters/composers 609) into a plurality of signals (e.g., analog signals), each of which is fed to a different channel 608 (each channel is associated to a pedix 1 . . . 4 in FIG. 6, which is not indicated in the text for conciseness). Each channel 608 (associated to a respective signal path 108) comprise an amplifier 610 (e.g., 110) which is subjected to distortion.

Each channel 608 includes a delay generator 619 which operates in coordination with the delay generators of the other channels to control beamforming.

In test mode, each channel 608 is calibrated, e.g., to determine necessary pre-distortion relationship. For example, techniques as discussed above is used.

In particular, in the test mode, instead of the input signal 602, a test input signal 602' (142') is injected by a test signal objection block 682 (part of the built-in test circuit) instead of by the external source 606. A detector 640 (part of the built-in test circuit) is used for determining the amplified test signal 604', which is provided to a RF to digital converter (which comprises an analog-to-digital converter, for example) and to a processor 634 (which be understood to implement a detector such as the detector 180 of FIG. 2 and which is part of the built-in test circuit).

The detector 640 comprises an IQ (inphase-quadrature) determiner which provides a version (which is analog in one embodiment) of the amplified test signal 604' in the IQ space. The IQ determiner is operative to:
multiply a version of the amplified test signal by a local oscillator (LO) signal, so as to provide the I version of the amplified test signal 604'; and
multiply a delayed version (delayed of 90°) of the amplified test signal by the LO signal, so as to provide the Q version of the amplified test signal 604'.

The I and Q versions of the amplified test signal 604' is converted into digital signals at the RF to digital converter 615, and provided to the processor 634 for determining the distortion information. Other kinds of detectors may notwithstanding be used.

A DC-removing filter 621 are placed between the signal source 606 and the splitters/composers 609. A DC-removing filter 623 are placed downstream of each amplifier 610. At least one of the DC-removing filters is a transformer-based filter (other types of filters be provided in other examples).

Receiving lines 613 is provided, e.g., each in parallel to a channel 608. For each channel 608, the parallel formed by the receiving line 613 and the channel 608 is in series to (e.g., downstream of) the respective delay generator 619.

During calibration (test session), the external source 606 is informed of distortion information obtained by the processor 634. Accordingly, the external source 606 derives a relationship mapping magnitudes of a digital input signal into symbols of the pre-distorted version of the digital input signal (e.g., using a signal conditioner 111). Thereafter, the pre-distorted version of the digital input signal is converted onto an analog version 602 and provided to the circuit arrangement 600. In some examples, the external source is integrated with the circuit arrangement 600. The pre-distortion is based on distortion relationships obtained in the calibration session. The pre-distortion is controlled by the common signal source 606.

Notably, one single RF to digital converter 615 and one single processor 634 are necessary for a plurality of amplifiers 610. At each calibration iteration, each channel 608 is calibrated, but only one single processor 634 and one single RF to digital converter 615 are used. No feedback-based technique is used.

Generally, examples are implemented as a computer program product with program instructions, the program instructions being operative for performing one of the methods when the computer program product runs on a computer. The program instructions are for example stored on a machine readable medium.

Other examples comprise the computer program for performing one of the methods described herein, stored on a machine-readable carrier.

In other words, an example of method is, therefore, a computer program having program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example of the method is, therefore, a data stream or a sequence of signals representing the computer program for performing one of the methods described herein. The data stream or the sequence of signals for example are e transferred via a data communication connection, for example via the Internet.

A further example comprises a processing means, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver is, for example, a computer, a mobile device, a memory device or the like. The apparatus or system includes, for example, comprise a file server for transferring the computer program to the receiver.

In some examples, a programmable logic device (for example, a field programmable gate array) is used to perform some or all of the functionalities of the methods described herein. In some examples, a field programmable gate array cooperates with a microprocessor in order to perform one of the methods described herein. Generally, the methods are performed by any appropriate hardware apparatus.

The above described examples are merely illustrative for the principles discussed above. It is understood that modifications and variations of the arrangements and the details described herein will be apparent. It is the intent, therefore, to be limited by the scope of the impending claims and not by the specific details presented by way of description and explanation of the examples herein.

Equal or equivalent elements or elements with equal or equivalent functionality are denoted in the following description by equal or equivalent reference numerals even if occurring in different figures.

The invention claimed is:

1. A circuit comprising:
   a common signal source operative to provide a common analog signal from a digital input signal;
   a plurality of amplifiers operative to amplify a split signal, the split signal being a split signal version of the common analog signal;
   a built-in test circuit operative to produce, via input of test signals to the plurality of amplifiers at different magnitudes, distortion information associated with distortion affecting the plurality of amplifiers;
   the common signal source operative to implement a signal conditioner that performs, in a signal path of the digital input signal, a feed-forward pre-distortion of the digital input signal according to a pre-distortion relationship mapping the digital input signal to a corresponding pre-distorted signal derived from the distortion information; and
   the signal conditioner operative to adjust the pre-distortion relationship depending on the distortion information provided by the built-in test circuit over time.

2. The circuit of claim 1, wherein the pre-distortion relationship maps magnitude information of the digital input signal to pre-distorted symbols of the corresponding pre-distorted signal of the digital input signal.

3. The circuit of claim 1, wherein the signal conditioner is operative to apply a variable phase shift to the digital input signal according to the pre-distortion relationship,
   wherein the signal conditioner is operative to adjust the pre-distortion relationship depending on the distortion information so that the pre-distortion relationship maps magnitude information of the digital input signal to a phase shift depending on the distortion information.

4. The circuit of claim 1, wherein the signal conditioner is operative to apply a gain to the digital input signal according to the pre-distortion relationship; and
   wherein the signal conditioner is operative to adjust the pre-distortion relationship depending on the distortion information so that the pre-distortion relationship maps magnitude information of the digital input signal to a gain depending on the distortion information.

5. The circuit of claim 1, wherein the pre-distortion relationship is non-linear.

6. The circuit of claim 1, wherein the built-in test circuit is operative to, during a test mode of inputting a test signal, determine a respective amplified signal at an output of each amplifier to derive the distortion information.

7. The circuit of claim 1, further comprising a test injection block operative to inject a first test signal of a selected amplitude to measure distortion with respect to the first test signal at outputs of the power amplifiers.

8. The circuit of claim 1, operative to: i) switch between a test mode and an operating mode, so as to, in the test mode, measure distortion and produce the distortion information, and ii) determine the relationship mapping of the digital input signal to a split pre-distorted signal version of the digital input signal.

9. The circuit of claim 1, wherein the signal conditioner is operative to pre-distort the digital input signal:
   for a comparatively large amount in case of comparatively large magnitude of the digital input signal; and
   for a comparatively small amount in case of comparatively small magnitude of the digital input signal.

10. The circuit of claim 1, wherein the signal conditioner is operative to apply the pre-distortion relationship so as to pre-distort the digital input signal:
    for a comparatively large amount in case of comparatively large distortion; and
    for a comparatively small amount in case of comparatively small distortion.

11. The circuit of claim 1, wherein each amplifier of the plurality of amplifiers is independently controlled according to a particular pre-distortion relationship.

12. The circuit of claim 11, wherein the built-in test circuit is operative to repeat a plurality of test iterations to measure, at each test iteration, distortion of the amplifiers and determine the pre-distortion relationship for one amplifier of the plurality of amplifiers.

13. The circuit of claim 1, further comprising an integrated circuit, on which each amplifier of the plurality of amplifiers and the built-in test circuit are mounted.

14. The circuit of claim 1, further comprising a radio frequency to digital converter connected to the plurality of amplifiers, the radio frequency to digital converter operative to convert a respective amplified test signal acquired from each amplifier in test mode.

15. A transmission/reception device comprising the circuit according to claim 1 and a plurality of antenna elements operatively connected to the amplifiers.

16. The circuit as in claim 1, wherein the signal conditioner is operative to map a magnitude of the digital input signal to the corresponding pre-distorted signal via a look-up table.

17. The circuit as in claim 16, wherein the look-up table is a constellation diagram of symbols.

18. The circuit as in claim 1, wherein the signal conditioner is operative to map different magnitudes of the digital input signal to corresponding pre-distorted signals via a look-up table.

19. The circuit as in claim 1, wherein the signal conditioner is operative to, while the built-in test circuit is disabled, map a magnitude of the digital input signal to phase shift adjustment information and gain adjustment information used to produce the corresponding pre-distorted signal.

20. The circuit as in claim 1 further comprising:
    multiple antennas driven by the plurality of amplifiers, the multiple antennas supporting beamforming.

21. The circuit as in claim 1, wherein the built-in test circuit includes a test injection block, the test injection block operative to inject a test signal of a selected amplitude to measure distortion with respect to the test signal at outputs of the power amplifiers;
    wherein the signal conditioner is operative to pre-distort the digital input signal: for a comparatively large amount in case of comparatively large magnitude of the digital input signal; and for a comparatively small amount in case of a comparatively small magnitude of the digital input signal, the circuit further comprising:
an integrated circuit, on which each amplifier of the plurality of amplifiers and the built-in test circuit are mounted.

22. The circuit as in claim 1, wherein the corresponding pre-distorted signal is applied as a feedforward pre-distorted signal to an amplifier of the plurality of amplifiers without feedback.

23. A method comprising:
performing, via input of test signals at different magnitudes, a calibration of each amplifier of multiple amplifiers;
via the calibration, acquiring distortion information regarding distortion impairing the multiple amplifiers;
receiving a digital input signal;
mapping, via the distortion information, the digital input signal to corresponding predistortion information;
applying the corresponding pre-distortion information to the received digital input signal, the corresponding pre-distortion adjusting the received digital signal to produce an adjusted signal; and
inputting the adjusted signal to the multiple amplifiers for amplification.

24. The method of claim 23, wherein performing the calibration includes: periodically calibrating the multiple amplifiers over time.

25. The method as in claim 23 further comprising:
applying the adjusted signal as a feedforward pre-distorted signal to an amplifier of the multiple amplifiers without feedback.

26. The method as in claim 23, wherein mapping the digital input signal to the corresponding pre-distortion information includes mapping a magnitude of the digital input signal to the predistortion information used to produce the adjusted signal.

27. The method as in claim 23 further comprising:
via a test injection block, during the calibration: i) injecting a test signal at different amplitudes into a first amplifier of the multiple amplifiers, the first amplifier amplifying the test signal, ii) measuring, at an output of the first amplifier, distortion with respect to the test signal at the different amplitudes, and iii) producing the distortion information based on the output of the first amplifier at the different amplitudes of the test signal.

28. The method as in claim 27 further comprising:
producing the distortion information as a map, the map mapping a respective amplitude of the test signal to corresponding pre-distortion associated with the first amplifier at the respective amplitude.

29. The method as in claim 28, wherein mapping the digital input signal to corresponding predistortion information includes:
mapping a magnitude of the digital input signal to the corresponding predistortion information, the method further comprising:
applying the adjusted signal as a feedforward adjustment to the digital input signal.

30. Computer-readable storage hardware having instructions stored thereon, the instructions, when executed by computer processor hardware, cause the computer processor hardware to:
perform, via input of test signals at different magnitudes, a calibration of each amplifier of multiple amplifiers;
via the calibration, acquire distortion information regarding distortion impairing the multiple amplifiers;
receive a digital input signal;
map, via the distortion information, the digital input signal to corresponding predistortion information;
apply the corresponding pre-distortion information to the received digital input signal, the corresponding pre-distortion adjusting the received digital signal to produce an adjusted signal; and
input the adjusted signal to the multiple amplifiers for amplification.

* * * * *